June 24, 1969 L. C. WHITE 3,452,198

MANUFACTURE OF DETECTORS

Filed Feb. 23, 1968

INVENTOR.
LORING C. WHITE

BY Gregor Field
ATTORNEY 3,452,198

MANUFACTURE OF DETECTORS

Loring C. White, Reading, Mass., assignor to Honeywell, Inc., Minneapolis, Minn., a corporation of Delaware Filed Feb. 23, 1968, Ser. No. 707,682
Int. Cl. H01j *39/00;* G01t *1/16*
U.S. Cl. 250—83 3 Claims

ABSTRACT OF THE DISCLOSURE

An improved method of manufacturing radiant energy detectors and detector arrays, and the improved devices so manufactured, in which a photoresist protects the detector material from direct contact with the adhesive securing it to its substrate.

*Field of the invention*

This invention relates to the field of radiant energy detectors and detector arrays, particularly to those effective in the infrared range, and of processes for manufacturing such detectors and arrays.

*Description of the prior art*

In the manufacture of radiant energy detectors and detector arrays, particularly those effective in the infrared range, it has been customary to make use of the detector material, for example indium antimonide, in the form of chips or slices cut from an ingot. One face of the chip is made flat, etched to give it a low surface recombination velocity, and adhesively secured to a substrate such as germanium. The other face of the chip is then worked flat so that the chip is of a required thickness, for example 15 microns, etched to give it a low surface recombination velocity, and passivated, if a single detector: if an array, the second face is treated with a photoresist and then further etched down to the substrate, to isolate the portions of the array as required. A final passivation process may also take place if desired. The above procedure gives devices which are initially very satisfactory, but which have been found to deteriorate to a point where detector efficiency may be seriously affected.

*Summary of the invention*

The exact cause of the deterioration just mentioned is not yet known, but my invention described below comprises a pragmatic cure which is simple, quick, and inexpensive. It comprises a reverse processing technique which results in the provision of a layer of photoresist between the detector material and the adhesive securing it to the substrate. Thus whether the deleterious effect of the adhesive on the detector is chemical, mechanical, or electrical, my invention prevents it from taking place without requiring any greater number of process steps or any different material or equipment than before.

Various objects, advantages, and features of novelty which make up my invention are pointed out with particularity in the claims annexed hereto and forming a part hereof. However, for a better understanding of the invention, its advantages, and objects attained by its use, reference should be had to the subjoined drawing, which forms a further part hereof, and to the accompanying descriptive matter, in which I have illustrated and described my invention.

Figure 1:
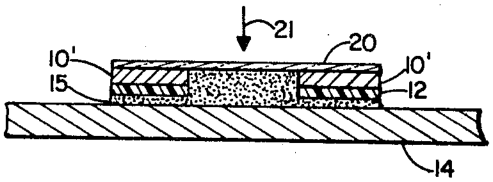
Figure 2A:
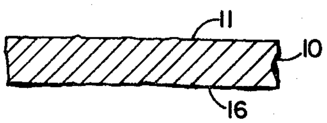
Figure 2B:
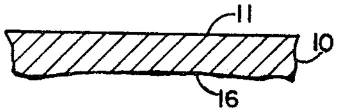
Figure 2C:
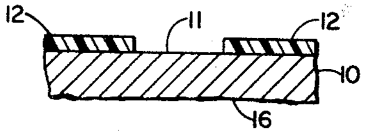
Figure 2D:
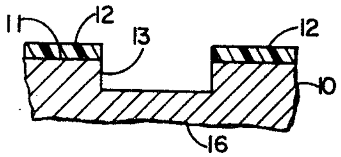
Figure 2E:
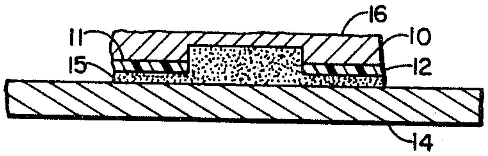
Figure 2F:
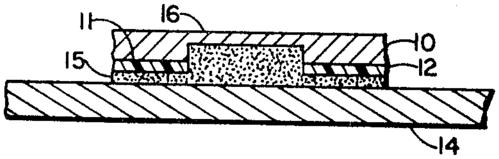
Figure 2G:
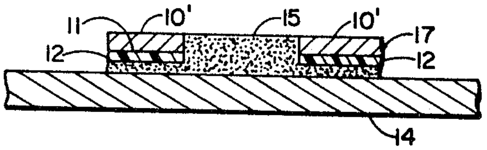

In the drawing, FIGURE 1 is a cross-sectional view of a detector array prepared according to my invention, and FIGURE 2 is illustrative of the processing steps performed in the preparation of the structure shown in FIGURE 1.

*Description of the preferred embodiment*

The practice of my invention to prepare a detector array as shown in FIGURE 1 begins with a chip or slice 10 of detector material such as indium antimonide. One face 11 of the chip is worked to flatness, as by lapping, and is etched to give it a low surface recombination velocity: a suitable etchant is made up of bromine and methanol. After removal of the etchant, the pattern of the array is layed out by application of a photoresist 12 to the areas which are not to be removed. I have found commercially available photoresists known as KMER, KPR, and KTFR to be satisfactory here. Etching is resumed until the thickness 13 of the material removed is greater than or at least as great as the desired thickness of the finished detector array. The etchant is again removed without removing the photoresist, and the chip is inverted and secured to a substrate 14 of suitable material such as germanium by an adhesive 15 which may conveniently be an epoxy resin. The second face 16 of the chip is now worked flat and parallel to face 11 until the desired thickness 17 has been achieved, and then etched, using the same etchant as before. This separates the various portions of the pattern to electronically isolate them, as suggested at 10′, 10′. After removal of the etchant, electrical contacts are attached to the desired regions and a passivating layer 20 of any suitable material may be applied if desired. The array is now ready to be mounted in a suitable manner to receive incident infrared radiation as indicated by the arrow 21 in FIGURE 1.

It will be appreciated that if a single detector rather than an array is desired surface 11 is completely covered with photoresist after etching, and is secured to the substrate, after which surface 16 is flattened, worked to thickness, etched, and passivated.

My process is thus effective to interpose a layer of inert material between one face of the detector material and the adhesive which secures it to the substrate. While it is true that direct contact between the adhesive material and the edges of the detector material does occur, the area involved is so small and the detection process is such that no significant deterioration of the detector efficiency results therefrom.

Numerous objects and advantages of my invention have been set forth in the foregoing description, and the novel features thereof are pointed out in the attached claims. The disclosure, however, is illustrative only, and I may make changes in detail, within the principle of the invention, to the full extent indicated by the broad general meaning in which the claims are expressed.

I claim as my invention:

1. A detector comprising a detector material, a substrate, means adhesively securing the detector material to the substrate, and means between said detector material and the adhesive for presenting deleterious interactions therebetween.

2. A device according to claim 1 in which said inert material comprises a photoresist.

3. A device according to claim 1 in which said detector comprises an array of spaced detector elements, the spaces between said elements containing adhesive material.

References Cited

UNITED STATES PATENTS

| | | | |
|---|---|---|---|
| 3,152,939 | 10/1964 | Borneman et al. | 156—3 |
| 3,383,508 | 5/1968 | Russell | 250—83 |

RALPH G. NILSON, *Primary Examiner.*
MORTON J. FROME, *Assistant Examiner.*

U.S. Cl. X.R.